US009918400B2

(12) United States Patent
LaPree et al.

(10) Patent No.: US 9,918,400 B2
(45) Date of Patent: *Mar. 13, 2018

(54) PERFORATED PANEL CONNECTION (71) Applicant: International Business Machines Corporation, Armonk, NY (US)

(72) Inventors: Scott R. LaPree, Rochester, MN (US); Stephen P. Mroz, Rochester, MN (US); Mark D. Pfeifer, Owatonna, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/584,378

(22) Filed: May 2, 2017

(65) Prior Publication Data

US 2017/0231106 A1    Aug. 10, 2017

Related U.S. Application Data (63) Continuation of application No. 15/437,811, filed on Feb. 21, 2017, now Pat. No. 9,723,757, which is a
(Continued)

(51) Int. Cl.
*A47B 43/00* (2006.01)
*H05K 7/14* (2006.01)
(Continued)

(52) U.S. Cl.
CPC ......... *H05K 7/1488* (2013.01); *A47B 96/201* (2013.01); *F16B 5/08* (2013.01);
(Continued)

(58) Field of Classification Search
CPC ......... A47B 47/03; A47B 47/05; A47B 96/00; A47B 96/20; A47B 96/201; A47B 96/205;
(Continued)

(56) References Cited

U.S. PATENT DOCUMENTS 537,569 A    4/1895    Flatau
1,693,274 A   11/1928   Hayman
(Continued)

FOREIGN PATENT DOCUMENTS

CH    492853 A      6/1970
CN    203003935 U   6/2013
(Continued)

OTHER PUBLICATIONS

Li, et al., "EMI Reduction from Airlfow Aperture Arrays Using Dual-Perforated Screens and Loss", IEEE Transactions of Electromagnetic Compatibility, vol. 42, No. 2, May 2000. pp. 135-141. Copyright 2000 IEEE.
(Continued)

*Primary Examiner* — Daniel J Troy
*Assistant Examiner* — Andres F Gallego
(74) *Attorney, Agent, or Firm* — Stosch Sabo (57) ABSTRACT

A server enclosure having a plurality of panels abutted to one another and constrained by a connector having a channel and at least one aperture. Each respective panel has at least one perpendicular portion being perpendicular to a face of the respective panel and adjoining a perimeter of the respective panel. Connectivity media coincident to the aperture can affix at least two panels and a connector to one another.

1 Claim, 6 Drawing Sheets

Related U.S. Application Data continuation of application No. 14/929,726, filed on Nov. 2, 2015, now Pat. No. 9,655,274.

(51) Int. Cl.

| | | |
|---|---|---|
| *A47B 96/20* | (2006.01) | |
| *F16B 5/08* | (2006.01) | |
| B44C 5/04 | (2006.01) | |
| H05K 5/02 | (2006.01) | |
| H05K 7/20 | (2006.01) | |

(52) U.S. Cl.
CPC .......... *B44C 5/0461* (2013.01); *H05K 5/0217* (2013.01); *H05K 7/20709* (2013.01)

(58) Field of Classification Search
CPC ... A47B 96/206; A47B 96/207; A47B 96/208; A47B 2220/0052; A47B 2220/0058; E04D 3/366; E04F 15/02038; H05K 7/20709; H05K 7/1488; H05K 7/18; H05K 5/0217; H05K 5/0243; B44C 5/04; B44C 5/0415; B44C 5/0416; Y10T 403/477; Y10T 403/478; Y10T 403/479
See application file for complete search history.

(56) References Cited

U.S. PATENT DOCUMENTS

| | | | |
|---|---|---|---|
| 2,904,144 A | 9/1959 | Clyde | |
| 3,213,583 A | 10/1965 | Wnski et al. | |
| 4,009,548 A | 3/1977 | Hicks | |
| 4,307,553 A | 12/1981 | Puckett | |
| 4,353,193 A | 10/1982 | Sanderson | |
| 4,366,656 A | 1/1983 | Simpson | |
| 4,443,508 A | 4/1984 | Mehl | |
| 4,736,551 A | 4/1988 | Higson | |
| 5,078,530 A | 1/1992 | Kim | |
| 5,193,321 A | 3/1993 | Edwards | |
| 5,715,639 A | 2/1998 | Yamada | |
| 6,322,235 B1 | 11/2001 | Strobel | |
| 8,925,255 B1 | 1/2015 | Haun et al. | |
| 9,572,287 B1 | 2/2017 | LaPree et al. | |
| 9,655,274 B1 * | 5/2017 | LaPree | H05K 7/20709 |
| 9,723,757 B2 * | 8/2017 | LaPree | H05K 7/20709 |
| 2009/0211190 A1 | 8/2009 | Honey | |
| 2009/0241317 A1 | 10/2009 | Kubler et al. | |
| 2012/0056516 A1 | 3/2012 | Fan | |
| 2013/0039006 A1 | 2/2013 | Li et al. | |
| 2015/0189787 A1 | 7/2015 | Bailey et al. | |
| 2015/0334866 A1 | 11/2015 | Bailey et al. | |

FOREIGN PATENT DOCUMENTS

| | | |
|---|---|---|
| GB | 2283071 A | 4/1995 |
| GB | 2458078 B | 7/2011 |
| JP | 09132947 A | 5/1997 |
| JP | 2003312657 A | 11/2003 |

OTHER PUBLICATIONS

Unknown, "McNichols Quality Accessories—U Edging Products", http://www.mcnichols.com/products/accessories/u-edging Last printed Aug. 11, 2015. 2 pages.

Unknown, "U-Channels & J-Channels", Johnson Bros. Metal Forming Co. http://www.johnsonrollforming.com/display.php/display/A1/category/2 Last printed Aug. 11, 2015. 15 pages.

Unknown, "Fabrication of Edges, Joints, Seams, and Notches", Integrated Publishing. Last printed Nov. 2, 2015. 12 pages. http://www.tpub.com/steelworker2/22.htm.

List of IBM Patents or Patent Applications Treated as Related, May 1, 2017. 2 pages.

LaPree et al., "Perforated Panel Connection", U.S. Appl. No. 14/929,726, filed Nov. 2, 2015.

U.S. Appl. No. 15/131,159, Accelerated Examination Search Document, dated Nov. 17, 2016. 13 pages.

LaPree et al., "Perforated Panel Connection", U.S. Appl. No. 15/437,811, filed Feb. 21, 2017.

* cited by examiner

PERFORATED PANEL CONNECTION

BACKGROUND

The present disclosure relates to joining two or more components, and more specifically, to joining two or more perforated components as part of a server enclosure.

SUMMARY

Aspects of the present disclosure relate to a method for fabricating a joint. The method can comprise perforating at least a portion of a first panel and a second panel. The method can further comprise forming at least one first perpendicular portion of the first panel and at least one second perpendicular portion of the second panel, where each respective perpendicular portion has a surface perpendicular to a face of the respective panel and coplanar to a plane formed by a thickness and a portion of a perimeter of the respective panel. The method can further comprise abutting the first perpendicular portion to the second perpendicular portion. The method can further comprise constraining the first perpendicular portion and the second perpendicular portion in a channel of a connector, where the connector comprises two approximately parallel surfaces connected by a third surface to form the channel, and where the third surface comprises at least one aperture comprising a geometry extruded through a thickness of the third surface to form at least one void on the third surface of the connector. The method can further comprise affixing the first perpendicular portion, the second perpendicular portion, and the connector.

Further aspects of the present disclosure can relate to a server enclosure. The server enclosure can comprise a plurality of sides forming an interior of the server enclosure, where the interior of the server enclosure is configured to hold one or more servers. Each side of the server enclosure can comprise a plurality of panels. Each panel can comprise a perforated face and at least one projection being approximately perpendicular to the perforated face and located on a portion of a perimeter of each respective panel. A plurality of connectors can adjoin each panel to at least one other panel, where each connector comprises a channel formed by a first portion parallel to a second portion and connected by a third portion separating the first portion and the second portion, and where the channel of each connector is fitted over at least two abutted projections of at least two panels. Each third portion of each connector can comprise at least one aperture comprising a void through a thickness of the third portion. A plurality of connections can affix each connector to at least two panels, where each respective connection is coincident to a respective aperture.

Further aspects of the present disclosure can relate to a joint. The joint can comprise a first panel having a first face and a first perpendicular portion and a second panel having a second face and a second perpendicular portion. Each perpendicular portion can be approximately perpendicular to a respective face and can be located along a perimeter of a respective panel. Each perpendicular portion can be perforated. The joint can further comprise a connector having a channel formed by a first surface connected to a second surface by a third surface. The third surface can comprise at least one aperture, where the at least one aperture can comprise a geometry extruded through a thickness of the third surface to create a void. The channel of the connector can house the first perpendicular portion and the second perpendicular portion abutted to one another for at least a first portion of a length of the first perpendicular portion. The joint can further comprise at least one connectivity media connecting the first panel, the second panel, and the connector. The at least one connectivity media can be located coincident to the at least one aperture.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to joining two or more components. More particular aspects relate to joining two or more perforated components as part of a server enclosure. Although not limited to such applications, an understanding of some embodiments of the present disclosure may be improved given the context of joining two or more perforated components.

According to some embodiments of the present disclosure, each component can comprise a face having one or more perpendicular portions attached to a perimeter of the face. In some cases, the one or more perpendicular portions can comprise a bent portion of the face (e.g., an approximately 90-degree bend on a portion of the face that adjoins a perimeter of the face). In some embodiments of the present disclosure, a first perpendicular portion is abutted to a second perpendicular portion and constrained to one another by a connector. The connector can comprise a first surface approximately parallel to a second surface and separated by a distance defined by a third surface connecting the first surface to the second surface. The first surface, second surface, and third surface can form a channel. In various embodiments, the cross section of the channel can form a "U" shape or a "C" shape corresponding to a curvilinear or linear third surface, respectively. The connector can further comprise one or more apertures on the third surface. The one or more apertures can comprise a geometry extruded through the thickness of the third surface such that a void is formed in the third surface (e.g., a key-slot, groove, notch, perforation). The abutted perpendicular portions can be located in the channel and constrained by the first surface, the second surface, and the third surface of the connector. The perpendicular portions can be affixed to the connector by a connectivity media being inserted into the one or more apertures of the connector and creating a permanent, semi-permanent, or temporary bond between the first perpendicular portion, the second perpendicular portion, and the connector.

In some embodiments, the joining of two or more components can be used to form an enclosure. In some cases, the enclosure can comprise a server rack. The server rack can be used to organize, store, and protect one or more servers or other electronic components.

The server rack can contain numerous designs and mechanisms useful to meeting structural, safety, thermal, electromagnetic compatibility (EMC), and other requirements. An example structural requirement can be a maximum load weight which can be safely stored in the enclosure. An example safety requirement can be no exposed edges in the enclosure. An example thermal requirement can be a maximum server rack interior temperature. In such a case, holes, slots, or other geometries beneficial to increasing air flow through the server rack can be applied to portions of the server rack to regulate the server rack temperature. In addition, geometries beneficial to modifying the surface area of the server rack can result in non-linear, non-planar, or multi-planar geometries within and/or between portions of the server rack. An example of an EMC requirement can be emitting electromagnetic radiation below a threshold. For such a requirement, it can be beneficial to use ferrous enclosure materials and to decrease the amount of voids through which electromagnetic emissions can enter or escape the enclosure. Thus, design and fabrication of an enclosure such as a server rack can require numerous considerations in order to meet various structural, safety, thermal, EMC, and other requirements.

Various embodiments of the present disclosure can exhibit design and fabrication advantages beneficial to an enclosure such as a server rack. Firstly, the connector component can increase the structural strength of an enclosure. Thus, components can be uniformly perforated without requiring custom manufactured components to retain structural integrity. Secondly, the connector component can improve safety by covering sharp edges associated with cut perforated panels. When a standard perforated panel is cut to size, a perimeter of the standard perforated panel can have numerous sharp portions which can lacerate and/or puncture equipment or users. Thirdly, the connector can consistently and accurately locate connecting sites using the apertures in the connector. Fourthly, the connection can contain limited voids such that electromagnetic emissions escaping through, or entering through, the connection are limited. Thus, in various embodiments, the connection of the present disclosure can decrease material and fabrication costs, increase safety, retain structural integrity, improve consistency, and reduce electromagnetic interference.

It is to be understood that the aforementioned advantages are example advantages of various embodiments of the present disclosure. Thus, some embodiments of the present disclosure can exhibit none, some, or all advantages listed hereinabove while remaining within the spirit and scope of the present disclosure. Furthermore, some embodiments of the present disclosure can exhibit additional advantages not listed hereinabove while remaining within the spirit and scope of the present disclosure.

Figure 1:
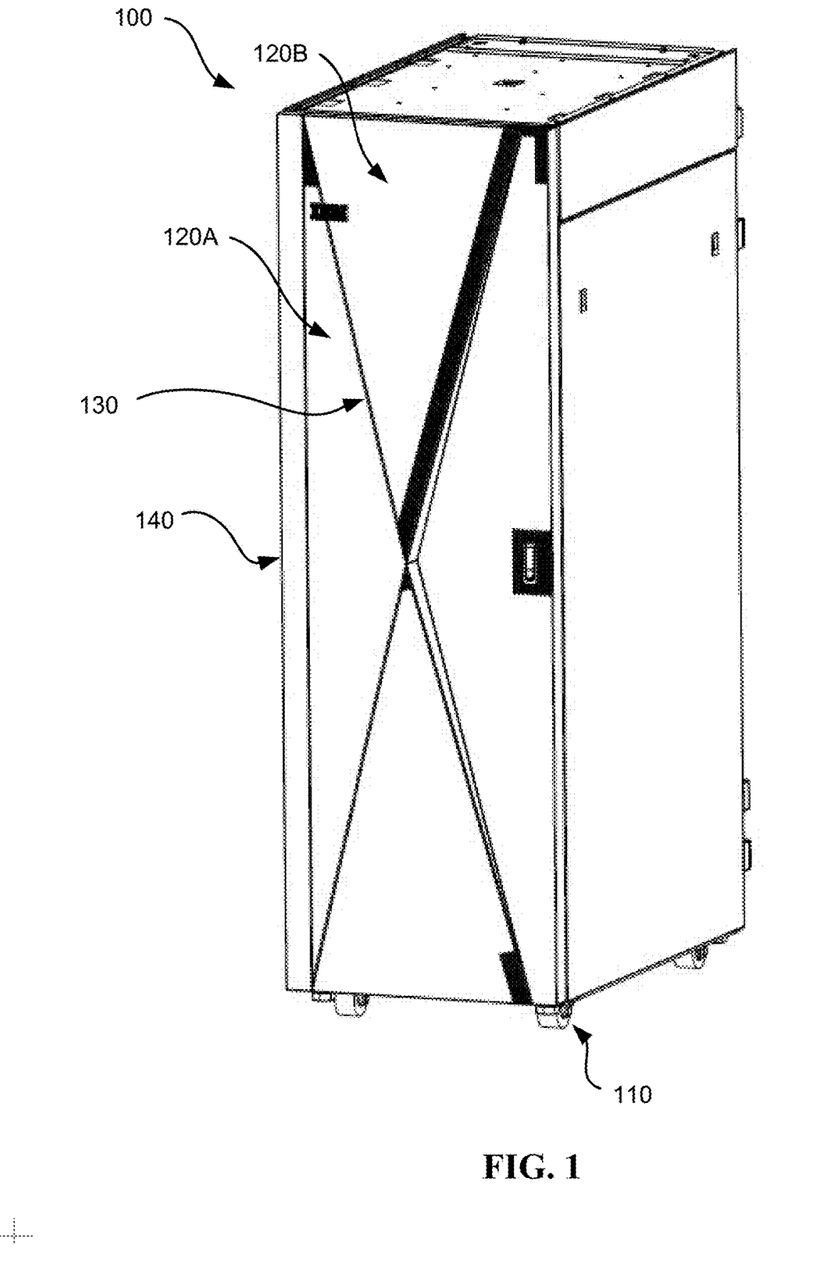
FIG. 1 illustrates an example server rack in accordance with some embodiments of the present disclosure.

Referring now to the drawings, FIG. 1 illustrates an example server rack in accordance with some embodiments of the present disclosure. Although the present disclosure is applicable to alternative structures, FIG. 1 will refer to a server rack in accordance with some embodiments of the present disclosure.

The server rack 100 can include one or more base supports 110 which can comprise legs, wheels, or other base supports suitable for bearing the weight of the server rack 100, enabling movement of the server rack 100, leveling the server rack 100, dampening vibrations between the environment and the server rack 100, electrically isolating (e.g., grounding) the server rack 100 from the environment, or otherwise improving various structural, ergonomic, and safety requirements associated with the server rack 100.

The server rack 100 can further comprise one or more panels 120A and 120B (generally referred to as panel 120 herein). The panels 120 can, in some embodiments, contain perforations of a variety of geometries which can assist in air flow through, and thereby the cooling of, the servers operating therein. In some cases, a single panel 120 forms a discrete side of the enclosure, while in alternative embodiments a plurality of panels 120 are used to form a discrete side of the enclosure. Respective sides of an enclosure can be joined to one another at corners such as corner 140. In some embodiments, portions of each respective panel 120 adjoining a corner can be non-perforated. Although the panels 120A and 120B are shown as being planar, the panels 120A and 120B can also comprise non-planar geometries such as, for example, curvilinear geometries. A panel 120A can be affixed to at least a second panel 120B and a connector (not shown) to form a joint 130. The connector can be located on the inside portion of each pair of adjacent panels (e.g., panel 120A and 120B). The underside of the front side of server rack 100 containing panels 120A and 120B and forming joint 130 will be described in further detail hereinafter with respect to FIG. 2.

Thus, FIG. 1 illustrates an example server rack in accordance with some embodiments of the present disclosure. Although the server rack 100 is shown as a rectangular shaped enclosure, numerous enclosure geometries are contemplated including enclosures having different dimensions, more faces, fewer faces, curvilinear faces, and other variations. In addition, various embodiments of the present disclosure can be used in applications involving structures other than an enclosure or in enclosures other than server racks.

Figure 2:
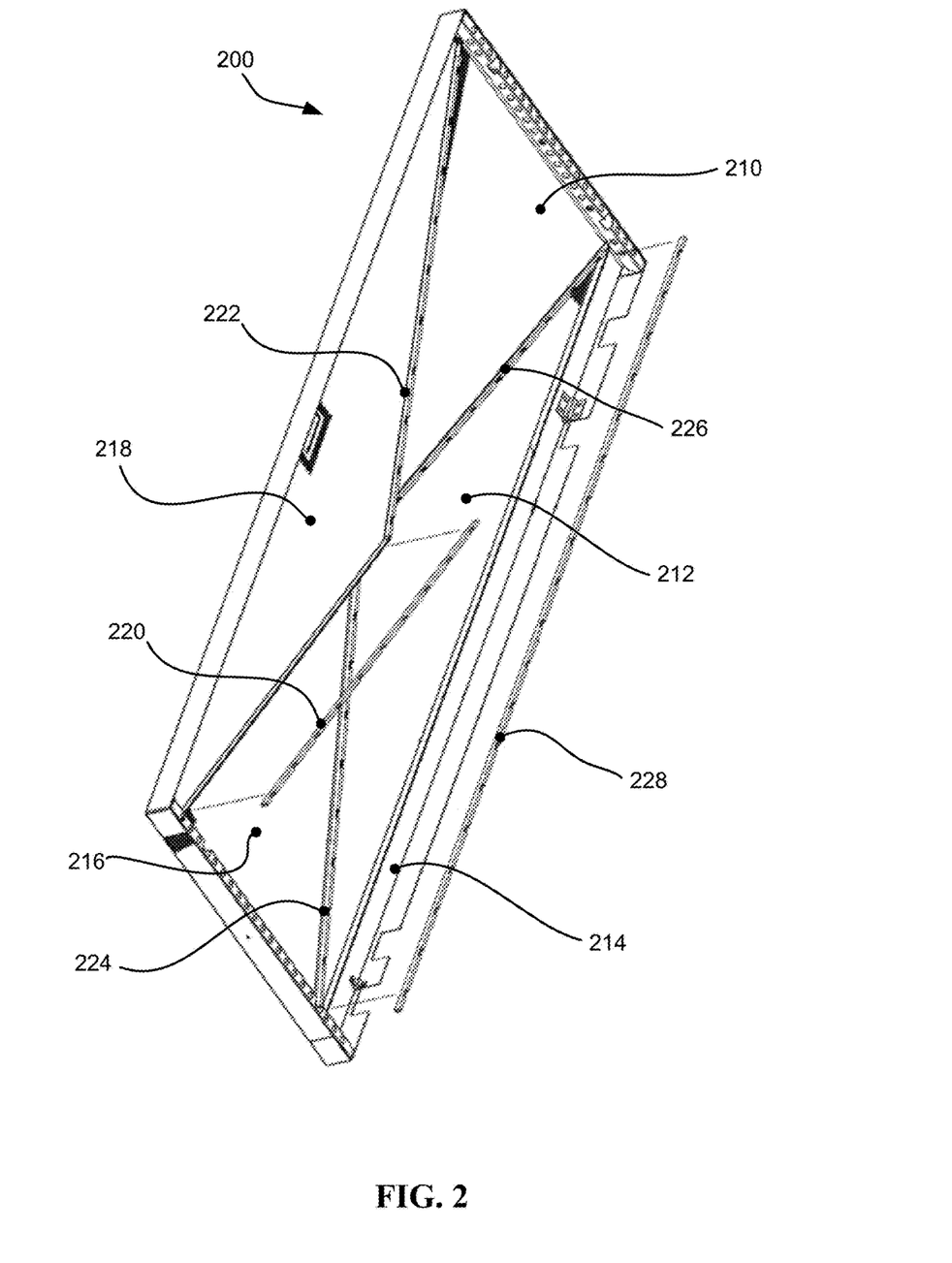
FIG. 2 illustrates an example portion of an enclosure in accordance with some embodiments of the present disclosure.

Referring now to FIG. 2, illustrated is an example portion of an enclosure in accordance with various embodiments of the present disclosure. The enclosure portion 200 can include a plurality of panels such as panels 210, 212, 214, 216, and 218. The panels can be similar or dissimilar shapes, and, in some cases, the panels can be perforated in whole or in part. Each panel shares at least one side with at least one other panel. The panels will be described in further detail hereinafter with respect to FIG. 3.

Each pair of panels is connected by a connector such as connectors 220, 222, 224, 226, and 228. Each connector can comprise a first surface parallel to a second surface and connected to one another by a third surface. Thus, each connector can form a channel. Each connector can include one or more apertures which can be used to affix two panels and a connector to one another. The connectors will be described in further detail hereinafter with respect to FIG. 4.

As an example, consider the panels 216 and 218 being connected by connector 220. One edge of panel 216 is abutted to one edge of panel 218. Connector 220 constrains the abutted edges of panel 216 and 218. Panel 216, panel 218, and connector 220 are then affixed to one another by a mechanical (e.g., fastener), chemical (e.g., adhesive), or other (e.g., weld) media or method suitable for affixing three components in the geometry described. Techniques employed in affixing the various components are described in further detail hereinafter with respect to FIG. 5 and FIG. 6.

Figure 3A:
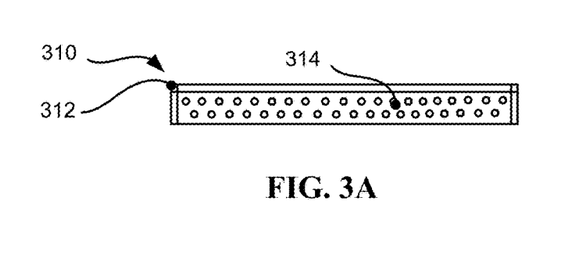
FIGS. 3A-3C illustrate front, top, and side view of an example panel in accordance with some embodiments of the present disclosure.
Figure 3B:
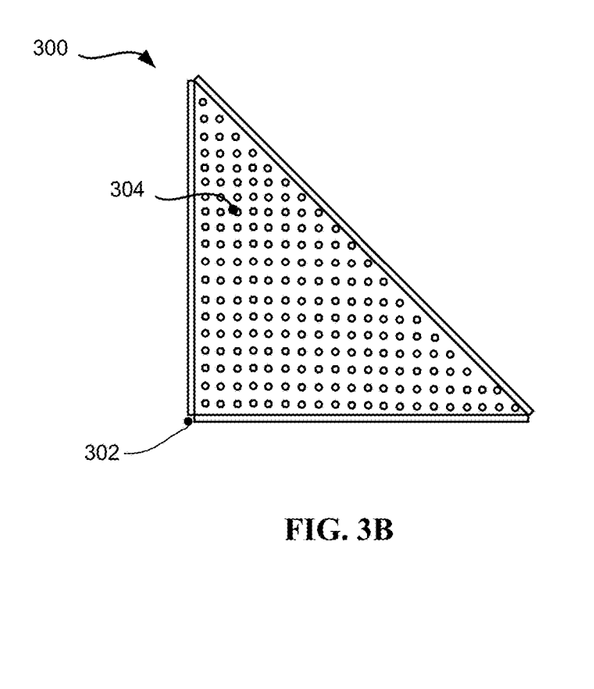
Figure 3C:
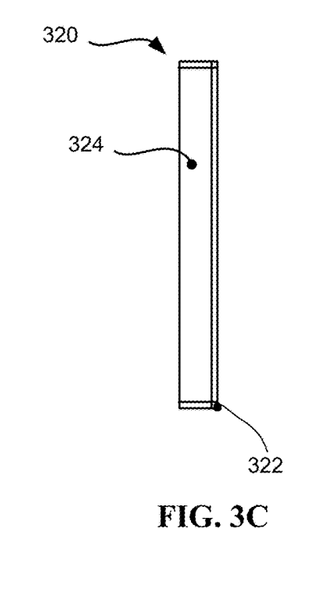

Referring now to FIG. 3, illustrated is an example panel in accordance with various embodiments of the present disclosure. In some embodiments, the example panel described in FIG. 3 can be the same or substantially the same as panels 120A and 120B of FIG. 1 or panels 210, 212, 214, 216, or 218 of FIG. 2. FIG. 3 presents a top view 300, front view 310, and side view 320 of the example panel. For reference, the point 302 of the top view 300 can be the same as point 312 of the front view 310 which can be the same as point 322 of the side view 320.

As can be seen in the top view 300, a panel face 304 can include a plurality of perforations. As can be seen in the front view 310, a perpendicular portion 314 of the panel can include a plurality of perforations. As can be seen in side view 320, a second perpendicular portion 324 of the panel can have no perforations. Thus, according to various embodiments, each panel can have one or more perpendicular portions, and each panel can comprise one or more perforated portions and one or more non-perforated portions. Although the perforations are shown as approximately circular, the perforations can be of any geometry or a combination of geometries.

Although not shown, the panel can contain ribs, flanges, or other geometries providing structural, economic, or other benefits to the panel. Furthermore, the panel can have projections, embossing, depressions, slots, notches, or other geometries beneficial to coupling the panel to one or more other panels, connectors, or fasteners.

In various embodiments, the panels can comprise metallic, polymeric, composite, or other materials. Accordingly, the panels can be manufactured by machining, forming, rolling, casting, molding, other methods, or combinations of the aforementioned methods.

Figure 4A:
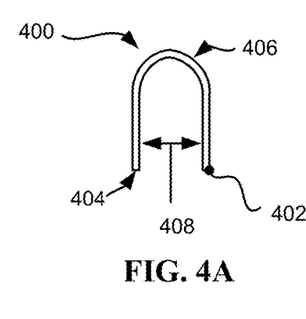
FIGS. 4A-4C illustrate front, bottom, and side views of an example connector in accordance with some embodiments of the present disclosure.
Figure 4B:
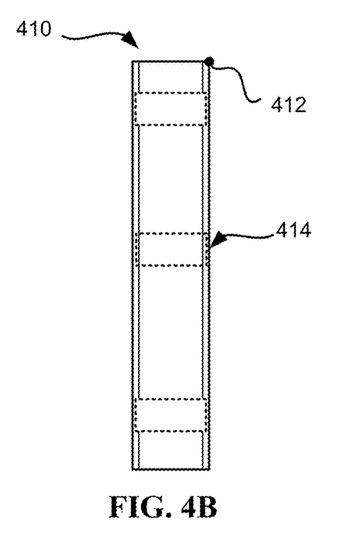
Figure 4C:
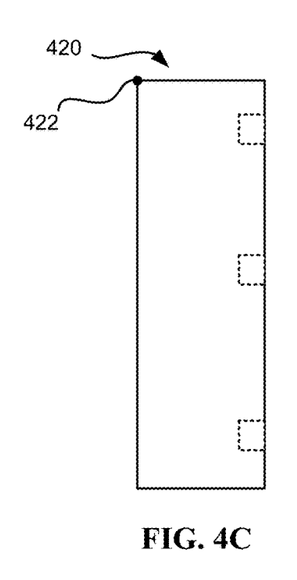

Referring now to FIG. 4, illustrated is an example connector in accordance with some embodiments of the present disclosure. In some embodiments of the present disclosure, the connector illustrated and described with respect to FIG. 4 can be the same or substantially the same as the connectors 220, 222, 224, 226, and 228 of FIG. 2. FIG. 4 illustrates a front view 400, a bottom view 410, and a side view 420. For reference, the point 402 of the front view 400 can be the same as point 412 of the bottom view 410 which can be the same as point 422 of the side view 420. As shown in the front view 400, the connector can comprise two approximately parallel portions separated by a distance 408 and connected by a third portion 406. The various portions can have a thickness 404 which can be constant, approximately constant, or variable across the various portions of the connector. As shown in the bottom view 410, the connector can include one or more apertures 414 creating a void through the thickness 404 of the connector.

Although the cross-section of the aperture 414 is shown as being rectangular, any number of geometries are possible which can have different dimensions, more sides, fewer sides, or curvilinear sides. Furthermore, the connector can have ribs, flanges, or other geometries beneficial to increasing strength, decreasing weight, or achieving other benefits to the connector. Further still, although not shown, the connector can have projections, embossing, depressions, slots, notches, or other geometries beneficial to coupling the connector to one or more panels, other connectors, or fasteners.

In various embodiments, the connectors can comprise metallic, polymeric, composite, or other materials. Accordingly, the connectors can be manufactured by a variety of methods such as machining, forming, casting, molding, other methods, or combinations of the aforementioned methods.

Figures 5A, 5B:
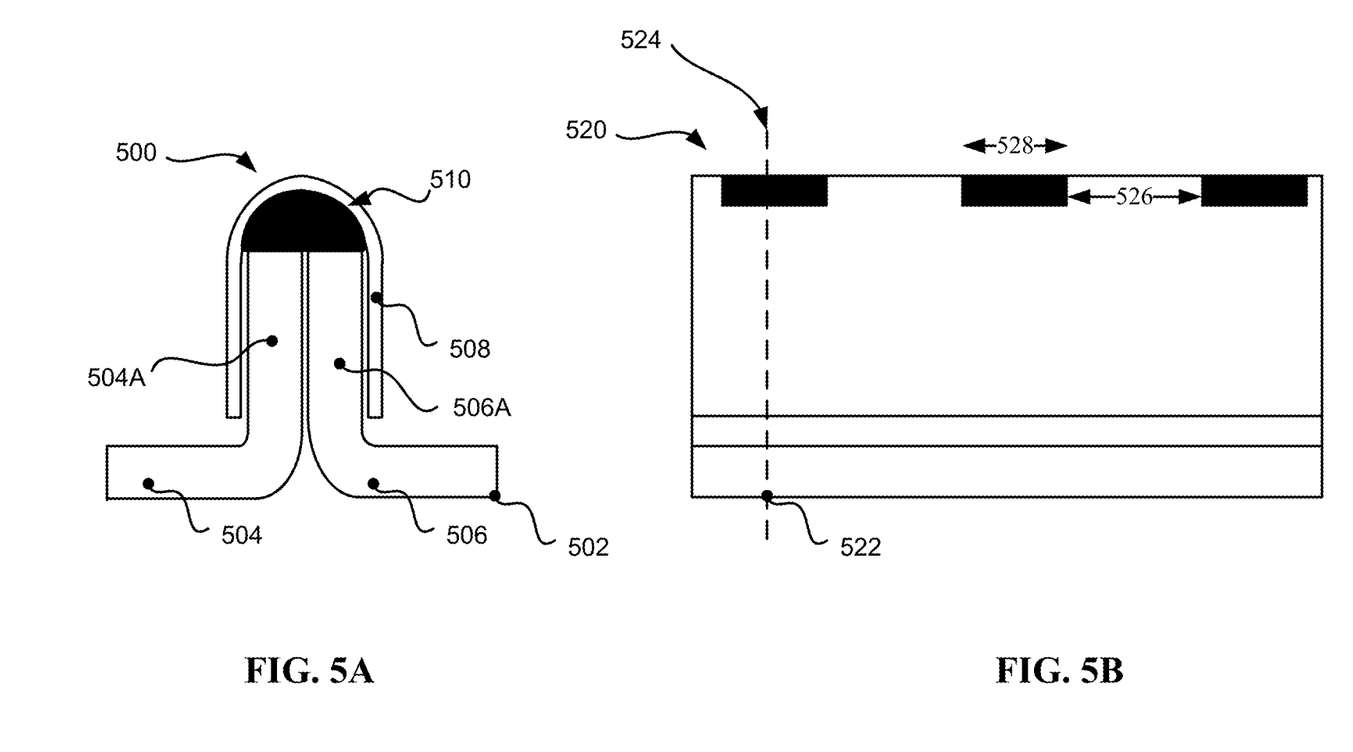
FIGS. 5A and 5B illustrate cross-sectional and side views of a joint in accordance with some embodiments of the present disclosure.

Referring now to FIG. 5, illustrated is a joint in accordance with some embodiments of the present disclosure. FIG. 5 presents a cross-sectional view 500 and a side view 520 of the joint. For reference, the point 502 of the cross-sectional view 500 can be the same as point 522 of the side view 520. Thus, the cross-sectional view 500 can correspond to a plane 524 intersecting the side view 520 as shown. The joint can comprise a first panel 504, a second panel 506, and a connector 508. The first panel 504 and the second panel 506 can be the same or substantially the same as the panel shown and described with respect to FIG. 3 in some embodiments. The first panel 504 can comprise a first perpendicular portion 504A, and the second panel 506 can comprise a second perpendicular portion 506A. The connector 508 can be the same or substantially the same as the connector described with reference to FIG. 4, in some embodiments. The first perpendicular portion 504A can be abutted to the second perpendicular portion 506A. The two panels can be constrained by a channel formed by connector 508. Connectivity media 510 (also referred to herein as a connection) can be placed in a void created by the first perpendicular portion 504A, the second perpendicular portion 506A, and the connector 508. The connectivity media 510 can affix the first perpendicular portion 504A, the second perpendicular portion 506A, and the connector 508 to one another. The connectivity media 510 can be applied over various lengths 528 and spaced at various intervals 526 as designated by the apertures of the connector 508. Although the connectivity media 510 is shown as forming an approximately semicircular cross section for an approximately linear length 528, any number of geometries are contemplated while remaining within the spirit and scope of the present disclosure. In various embodiments, numerous techniques and mechanisms can be used to connect the first perpendicular portion 504A, the second perpendicular portion 506A, and the connector 508 to one another. For example, the connectivity media 510 can be a weld, an adhesive, or a mechanical fastener, among others. As a result, the connectivity media 510 can comprise a volume, a discrete component, or a component integrated onto a panel or connector according to various embodiments of the present disclosure.

In cases where the connectivity media 510 comprises a weld, the welding can be performed by, for example, shielded metal arc welding (SMAW), gas tungsten arc welding (GTAW), gas metal arc welding (GMAW), flux-cored arc welding (FCAW), submerged arc welding (SAW), electroslag welding (ESW), among others. In various applications, the welding energy can be produced by gas, electricity, a laser, an electron beam, ultrasonic waves, magnetic waves, friction, or other sources.

In cases where the connectivity media 510 comprises an adhesive, the adhesive can include, but is not limited to, drying adhesives (e.g., solvent based adhesives or emulsion adhesives), pressure sensitive adhesives (e.g., acrylate polymers having controlled molecular weights), contact adhesives (e.g., polymeric or elastomeric compounds undergoing pressure-induced strain crystallization such as polychloroprene), multi-part adhesives (e.g., reactive combinations of polyesters, polyurethanes, polyols, acrylics, epoxies, and other resins), one part adhesives (e.g., compounds or combinations thereof which react in the presence of ultraviolet (UV) radiation, heat, moisture, or other environmental factors), and others.

In cases where the connectivity media 510 comprises one or more mechanical fasteners, the one or more mechanical fasteners can include, but are not limited to, fasteners (e.g., screws, nails, bolts, rivets), push-fit or snap-fit components (e.g., clips, cotters, retaining rings, or custom interlocks), and other mechanical fastening methods and mechanisms such as shrink-fitting, interference-fitting, and others.

Figure 6:
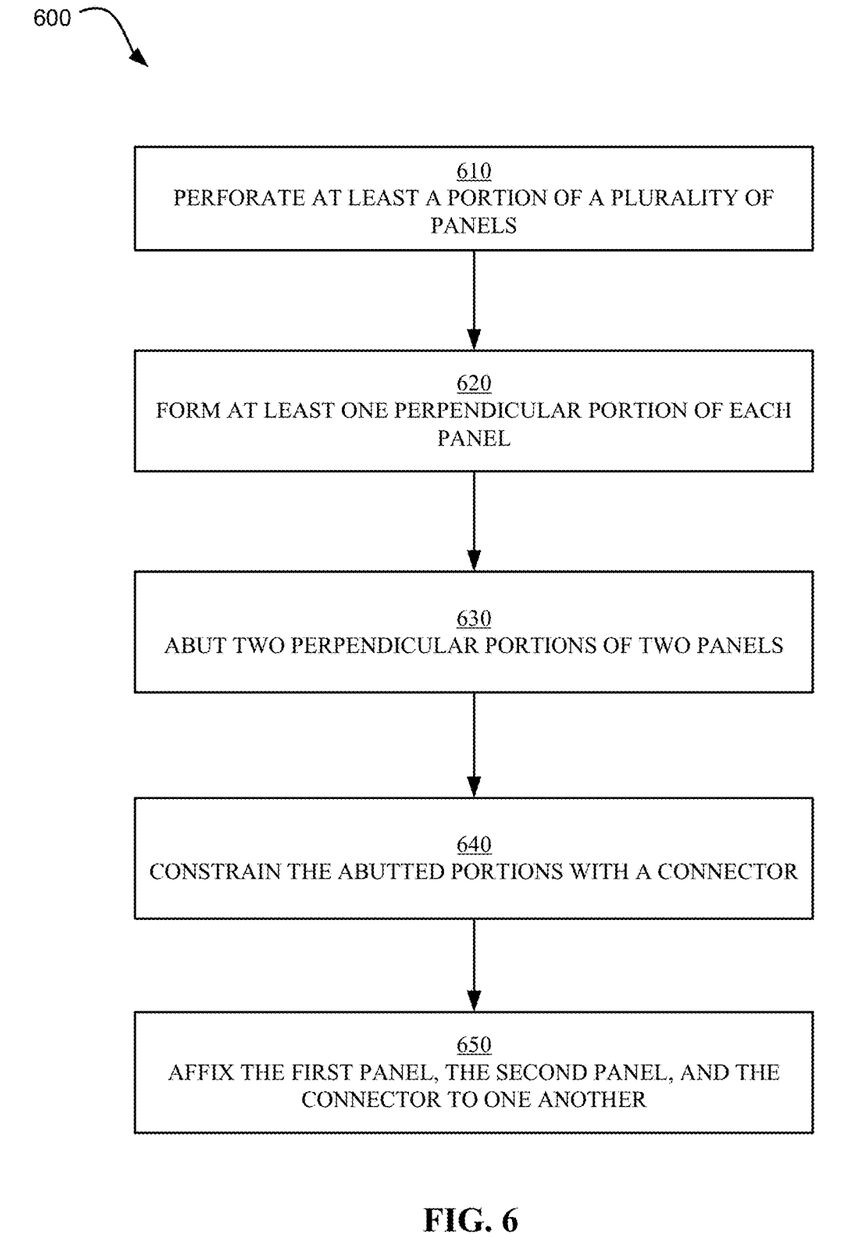
FIG. 6 illustrates a flowchart for a method for fabricating a connection in accordance with some embodiments of the present disclosure.

Referring now to FIG. 6, illustrated is a flowchart for a method for fabricating a joint or connection in accordance with some embodiments of the present disclosure. The method 600 can begin with operation 610 by perforating at least a portion of one or more panels. The perforations can be any number of geometries such as, but not limited to, ovoidal, rectangular or other geometries.

In operation 620, at least one perpendicular portion can be formed for each respective panel. The perpendicular portion can be formed along a perimeter of a panel. The perpendicular portion can be formed by bending a portion of the panel adjoining the perimeter of the panel. Or, in some embodiments, the perpendicular portion can be a discrete portion which is affixed to a portion of the perimeter of the panel. A face of the perpendicular portion can be coplanar to a face formed by a thickness of the panel and a portion of a perimeter of the panel. In various embodiments, the panel shown and described with respect to FIG. 3 can be the same or substantially the same as the panel created following operation 620.

In operation 630, two perpendicular portions of two panels can be abutted to one another. The perpendicular portions can be abutted such that a first perpendicular portion is substantially parallel to the second perpendicular portion, and furthermore, in some embodiments, such that one edge of a first perpendicular portion is approximately collinear to a second edge of the second perpendicular portion.

In operation 640, the abutted perpendicular portions can be constrained by a connector such that the abutted perpendicular portions are housed in a channel formed by two parallel surfaces connected by a third surface of the connector. The connector can house the two perpendicular portions for at least a portion of the length of the perpendicular portions. The connector can include one or more apertures forming one or more voids on the third surface of the connector.

In operation 650, the first perpendicular portion, the second perpendicular portion, and the connector can be affixed to one another. The first perpendicular portion, the second perpendicular portion, and the connector can be affixed to one another by, for example, a weld, an adhesive, a mechanical fastener, or a different technique. The affixing can be located coincident to one or more apertures of the connector. In some embodiments, the affixing comprises interlocking the connector, the first perpendicular portion, and the second perpendicular portion to one another. The interlocking can be a function of one or more interlocks in some embodiments. The one or more interlocks can comprise projections, depressions, slots, or other geometries integrated into one or more of the connector, the first perpendicular portion, the second perpendicular portion, or other aspects of the joint or connection according to various embodiments of the present disclosure.

Thus, various aspects of the present disclosure relate to a connection, more particular aspects of the present disclosure relate to coupling two or more perforated panels using a connector. The connection can provide, in various embodiments and among other benefits, improved strength, safety, and cost.

What is claimed is:

1. A server enclosure comprising:
    a plurality of sides forming an interior of the server enclosure, wherein the interior of the server enclosure is configured to hold one or more servers therein;
    wherein at least one side of the server enclosure comprises a plurality of panels, wherein each panel comprises a metallic material, wherein each panel comprises a face having perpendicular portions at each edge of a perimeter of the face and being perpendicular to the face, wherein the face is perforated and at least one of the perpendicular portions is not perforated, wherein each face of each panel comprises a triangular geometry;
    wherein a plurality of connectors adjoin the plurality of panels to each other, wherein each connector comprises a metallic material, wherein each connector comprises a channel formed by a first portion parallel to a second portion and connected by a third portion separating the first portion and the second portion, wherein the third portion comprises a variable thickness, wherein the channel of each connector is respectively fitted over at least two respective and abutted ones of the perpendicular portions of at least two of the plurality of panels, wherein each third portion of each connector comprises a plurality of apertures defining voids through the variable thickness of the third portion; and
    wherein a plurality of connections respectively affix each connector to the plurality of panels, wherein each connection is respectively coincident to respective ones of said plurality of apertures, wherein each connection comprises a weld.

* * * * *